US011750947B2

United States Patent
Lei

(10) Patent No.: US 11,750,947 B2
(45) Date of Patent: Sep. 5, 2023

(54) GATE VOLTAGE ADJUSTMENT CIRCUIT, GATE VOLTAGE ADJUSTMENT METHOD AND SENSOR APPLYING SAME

(71) Applicant: Ningbo ABAX Sensing Electronic Technology Co., Ltd., Ningbo (CN)

(72) Inventor: Shuyu Lei, Ningbo (CN)

(73) Assignee: Ningbo ABAX Sensing Electronic Technology Co., Ltd., Ningbo (CN)

( * ) Notice: Subject to any disclaimer, the term of this patent is extended or adjusted under 35 U.S.C. 154(b) by 6 days.

(21) Appl. No.: 17/616,320

(22) PCT Filed: Oct. 9, 2019

(86) PCT No.: PCT/CN2019/110221
§ 371 (c)(1),
(2) Date: Dec. 3, 2021

(87) PCT Pub. No.: WO2020/244105
PCT Pub. Date: Dec. 10, 2020

(65) Prior Publication Data
US 2022/0321813 A1    Oct. 6, 2022

(30) Foreign Application Priority Data
Jun. 4, 2019  (CN) .......................... 201910478943.8

(51) Int. Cl.
*H04N 25/709*    (2023.01)
*G01J 1/44*    (2006.01)
*G05F 1/46*    (2006.01)

(52) U.S. Cl.
CPC .............. *H04N 25/709* (2023.01); *G01J 1/44* (2013.01); *G05F 1/46* (2013.01)

(58) Field of Classification Search
CPC .............. H04N 25/709; G01J 1/44; G05F 1/46
See application file for complete search history.

(56) References Cited

U.S. PATENT DOCUMENTS

| 8,502,767 | B2 | 8/2013 | Lee et al. |
| 2005/0146350 | A1 | 7/2005 | Kim et al. |
| 2018/0203117 | A1* | 7/2018 | De Coi ................. G01S 17/894 |

FOREIGN PATENT DOCUMENTS

| CN | 101169920 A | 4/2008 |
| CN | 101442292 A | 5/2009 |

(Continued)

OTHER PUBLICATIONS

International Search Report, China National Intellectual Property Administration, Application No. PCT/CN2019/110221, dated Mar. 9, 2020, 4 pages.

*Primary Examiner* — Thanh Luu
(74) *Attorney, Agent, or Firm* — ZIEGLER IP LAW GROUP LLC

(57) ABSTRACT

There are provided a circuit and a method for regulating a gate voltage, and a sensor applying the circuit. In the circuit, an input end of the storage module is connected to a first end of a signal storage unit, an output end thereof is connected to an input end of the comparison module, an output end of the comparison module is connected to an input end of the voltage regulation module, and an output end of the voltage regulation module is connected to a transmission gate. The storage module stores electrical signals outputted by the signal storage unit. The comparison module compares at least two of the electrical signals correspond to different gate voltages to obtain a comparison result. The voltage regulation module regulates, based on the comparison result, an output voltage according to a predetermined rule to change the gate voltage.

17 Claims, 4 Drawing Sheets

(56) References Cited

FOREIGN PATENT DOCUMENTS

| CN | 103208970 A | 7/2013 |
|---|---|---|
| JP | 2017005565 A | 1/2017 |

* cited by examiner

GATE VOLTAGE ADJUSTMENT CIRCUIT, GATE VOLTAGE ADJUSTMENT METHOD AND SENSOR APPLYING SAME

CROSS REFERENCE TO RELATED APPLICATION

The present application is the national phase of PCT International Application No. PCN/CN2019/110221, which claims priority to Chinese Patent Application No. CN201910478943.8, titled "GATE VOLTAGE ADJUSTMENT CIRCUIT, GATE VOLTAGE ADJUSTMENT METHOD AND SENSOR APPLYING SAME", filed on Jun. 4, 2019 with the Chinese Patent Office, both of which are incorporated herein by reference in their entireties.

FIELD

The present disclosure relates to the technical field of electronic circuits, and in particular to a circuit for regulating a gate voltage, a method for regulating a gate voltage, and a sensor applying the same.

BACKGROUND

Sensors are widely used in consumer, medical, aerospace and other fields. With the development of the science and technology, the application scope of the sensors is continually expanded, occupying an extremely important position in the fields of emerging artificial intelligence, lidar, and smart phones. These new application fields require high imaging accuracy of the sensor.

The following description is given by taking an image sensor as an example. The key to imaging of the image sensor lies in photoelectric conversion of a photodiode and transfer of photo-generated charges. FIG. 1 is a schematic diagram of a pixel structure of a photoelectric sensor. In FIG. 1, a photodiode PD generates photo-generated charges under light conditions, and the photo-generated charges are transferred under the control of a transmission gate TX, for example, transferred to a floating diffusion node FD shown in FIG. 1, and the imaging is performed through a post-processing unit. A magnitude of a voltage (which is referred to as a gate voltage) applied to the TX has an important influence on the charge transfer performance. FIG. 2a and FIG. 2b are schematic diagrams of potential distribution of the PD, a region under the gate of the TX, and the FD in a case that the TX is turned off and in a case that the TX is turned on, respectively. In the case that the TX is turned off, the potential of the region under the gate is lower than those of the PD and the PD, which prevents electrons from transferring from the PD to the FD. In the case that the TX is turned on, the potential of the region under the gate is between the potential of the PD and the potential of the FD, and the photo-generated charges are transferred from the PD to the FD through the region under the gate of the TX. In a case that the gate voltage is relative small, a voltage difference between the region under the gate of the TX and the PD is relative small, which affects the charge transfer efficiency. In addition, in a case that the gate voltage is relative high, a relative large number of charges are remained in the region under the gate of the TX, while a voltage difference between the region under the gate of the TX and the FD is relative small, resulting in a decrease in the charges transferred to the FD in the turn-off state. In this case, a part of the charges are injected into the PD, affecting the imaging accuracy of the sensor.

Therefore, it is desirable to provide a circuit for regulating a gate voltage, a method for regulating a gate voltage, and a sensor applying the same, to reduce charge injection and improve charge transfer efficiency.

SUMMARY

In order to overcome the problems in the conventional technology, there are provided a circuit for regulating a gate voltage, a method for regulating a gate voltage, and a sensor applying the same according to embodiments of the present disclosure, to reduce charge injection and improve charge transfer efficiency.

In a first aspect of the embodiments of the present disclosure, a circuit for regulating a gate voltage is provided. The circuit includes a storage module, a comparison module, and a voltage regulation module.

An input end of the storage module is connected to a first end of a signal storage unit, and an output end of the storage module is connected to an input end of the comparison module. An output end of the comparison module is connected to an input end of the voltage regulation module. An output end of the voltage regulation module is connected to a transmission gate. The storage module is configured to store electrical signals outputted by the signal storage unit. The comparison module is configured to compare at least two electrical signals that correspond to different gate voltages and that are outputted by the signal storage unit to obtain a comparison result. The voltage regulation module is configured to regulate, based on the comparison result, an output voltage according to a predetermined rule to change the gate voltage of the transmission gate.

In an embodiment of the present disclosure, the storage module includes at least two storage units. An input end of each storage unit is connected to the input end of the storage module, and an output end of the storage unit is connected to at least one input terminal of the comparison module. The at least two storage units include a first storage unit and a second storage unit. The first storage unit is connected to the input end of the storage module via a first switch, and the first storage unit is connected to one input terminal of the comparison module via an eighth switch. The second storage unit is connected to the input end of the storage module via a second switch, and the second storage unit is connected to the other input terminal of the comparison module via a ninth switch.

In an embodiment of the present disclosure, the voltage regulation module includes: a counting unit and a digital-to-analog conversion unit. An input end of the counting unit is connected to the input end of the voltage regulation module, and the counting unit is configured to perform accumulative counting according to the comparison result. One end of the digital-to-analog conversion unit is connected to an output end of the counting unit, and the other end of the digital-to-analog conversion unit is connected to the output end of the voltage regulation module. The digital-to-analog conversion unit is configured to convert and output a corresponding voltage based on the accumulated count according to a predetermined correspondence relationship.

In an embodiment of the present disclosure, the circuit for regulating a gate voltage further includes an electrical signal acquisition unit. One end of the electrical signal acquisition unit is connected to the first end of the signal storage unit, and the other end of the electrical signal acquisition unit is connected to the input end of the storage module. The electrical signal acquisition unit is configured to acquire the electrical signals outputted by the signal storage unit and output the electrical signals to the storage module.

In an embodiment of the present disclosure, the circuit for regulating a gate voltage further includes a control unit. One end of the control unit is connected to the output end of the voltage regulation module, and the other end of the control unit is connected to the transmission gate. The control unit is configured to apply, based on a predetermined condition, the voltage outputted by the voltage regulation module to the transmission gate.

In an embodiment of the present disclosure, the circuit for regulating a gate voltage further includes an electrical signal processing unit. One end of the electrical signal processing unit is connected to the first end of the signal storage unit, and the other end of the electrical signal processing unit is connected to the input end of the storage module. The electrical signal processing unit is configured to convert a current signal into a voltage signal or convert a voltage signal into a current signal.

In an embodiment of the present disclosure, the circuit for regulating a gate voltage further includes a signal providing unit. The signal providing unit is connected to a first end of a signal conversion unit via a third switch, and the signal providing unit is configured to input a to-be-converted signal to the signal conversion unit.

In an embodiment of the present disclosure, the circuit for regulating a gate voltage further includes a reset module. The reset module includes at least one of the following reset units: a first reset unit, a second reset unit and a third reset unit. The first reset unit is connected to the first end of the signal conversion unit via a fourth switch, and the first reset unit is configured to reset the signal conversion unit. The second reset unit is connected to the first end of the signal storage unit via a fifth switch, and the second reset unit is configured to reset the signal storage unit. The third reset unit is connected to the first storage unit via a sixth switch and is connected to the second storage unit via a seventh switch, and the third reset unit is configured to reset the at least two storage units.

In the first aspect of the embodiments of the present disclosure, a method for regulating a gate voltage is provided. The method is performed by the circuit for regulating a gate voltage. The method includes:

comparing electrical signals that are outputted by the signal storage unit after being applied with different gate voltages and that are stored in the storage module to obtain a comparison result; and regulating, based on the comparison result, an output voltage of the voltage regulation module according to the predetermined rule, where the regulated output voltage of the voltage regulation module serves as a gate voltage for a next period.

In an embodiment of the present disclosure, the regulating, based on the comparison result, an output voltage of the voltage regulation module according to the predetermined rule includes:

in a case that the electrical signal outputted by the signal storage unit is a voltage signal, increasing the output voltage by the voltage regulation module if a current electrical signal value of the signal storage unit is less than an electrical signal value in a previous period, otherwise decreasing the output voltage; and in a case that the electrical signal outputted by the signal storage unit is a current signal, increasing the output voltage by the voltage regulation module if a current electrical signal value of the signal storage unit is greater than an electrical signal value in a previous period, otherwise decreasing the output voltage.

In an embodiment of the present disclosure, the method for regulating a gate voltage further includes: determining whether the comparison result meets a predetermined condition to determine an optimal gate voltage; and determining a value range of the gate voltage based on the optimal gate voltage. The determining whether the comparison result meets a predetermined condition to determine an optimal gate voltage includes: determining whether the comparison result changes; and if the comparison result changes, determining the output voltage of the voltage regulation module corresponding to a current period as the optimal gate voltage.

In an embodiment of the present disclosure, the comparing electrical signals that are outputted by the signal storage unit after being applied with different gate voltages and that are stored in the storage module to obtain a comparison result includes: turning on the eighth switch and the ninth switch, inputting current electrical signals respectively stored in the first storage unit and the second storage unit into the comparison module for comparison, and turning off the eighth switch and the ninth switch after obtaining a comparison result. Before the eighth switch and the ninth switch are turned on, the method further includes: turning on the second switch to store the current electrical signal of the signal storage unit in the second storage unit. After the eighth switch and the ninth switch are turned off, the method further includes: turning on the first switch to store the current electrical signal of the signal storage unit in the first storage unit.

In an embodiment of the present disclosure, before the turning on the second switch to store the current electrical signal of the signal storage unit in the second storage unit, the method further includes: turning on the seventh switch, and resetting the second storage unit by the third reset unit. Before the turning on the first switch to store the current electrical signal of the signal storage unit in the first storage unit, the method further includes: turning on the sixth switch, and resetting the first storage unit by the third reset unit.

In an embodiment of the present disclosure, regulating the output voltage of the voltage regulation module according to the predetermined rule includes: accumulatively counting the inputted comparison result by the counting unit; and converting, by the digital-to-analog conversion unit, the accumulated counting result into a corresponding voltage according to a predetermined correspondence relationship, as the output voltage of the voltage regulation module.

In an embodiment of the present disclosure, before the output voltage of the voltage regulation module is applied to the transmission gate, the method further includes: turning on the fifth switch, and resetting the signal storage unit by the second reset unit; turning on the fourth switch, and resetting the signal conversion unit by the first reset unit; and turning on the third switch, and inputting, by the signal providing unit, a preset number of signals to the signal conversion unit.

In a third aspect of the embodiments of the present disclosure, a sensor is provided. The sensor includes at least one pixel. The at least one pixel is connected to the circuit for regulating a gate voltage described in the first aspect.

With the technical solutions of the present disclosure, the electrical signals of the signal storage unit under different gate voltages are compared to present the comprehensive influence of different gate voltages on the charge injection and the charge transfer efficiency. Based on the comparison result, the gate voltage is regulated in a value range, in which there is little or no charge injection and the charge transfer efficiency is relative high. The gate voltage of the transmission gate of other pixels in the sensor can be further controlled based on the value range of the gate voltage.

BRIEF DESCRIPTION OF THE DRAWINGS

FIG. 2b is a schematic diagram of potential distribution of the PD, the region under the gate of TX, and the FD in a case that the TX is turned on;

DETAILED DESCRIPTION OF EMBODIMENTS

The principle and spirit of the present disclosure are described below with reference to several exemplary embodiments. It should be understood that these embodiments are given only to enable those skilled in the art to better understand and implement the present disclosure, but not to limit the scope of the present disclosure in any way. Further, these embodiments are provided to make the present disclosure more thorough and complete, and to fully convey the scope of the present disclosure to those skilled in the art.

It should be understood that when a unit/module is described as "being connected", the unit/module may be connected to another unit/module directly or via an intermediate unit/module. In contrast, if the unit/module is described as "being directly connected", no intermediate unit/module exists.

It should be noted that terms such as "first" and "second" in the specification and claims of the present disclosure and the drawings are used to distinguish similar objects but not limit a specific order or sequence. It should be understood that the data used in this way can be interchanged under appropriate circumstances so that the embodiments of the present disclosure described herein can be implemented in a sequence other than those illustrated or described herein.

The key to imaging of an image sensor lies in photoelectric conversion of a photodiode and transfer of photo-generated charges.

It is found by the inventor that a gate voltage of a transmission gate influences the transfer of the photo-generated charges mainly in the following two aspects: a charge transfer efficiency in a case that the transmission gate is turned on, and injection of charges remaining under the transmission gate back into a photodiode PD (i.e., a signal conversion unit) in a case that the transmission gate is turned off.

Figure 1:
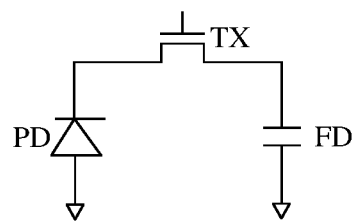
FIG. 1 is a schematic diagram of a pixel structure of a photoelectric sensor.
Figure 2A:
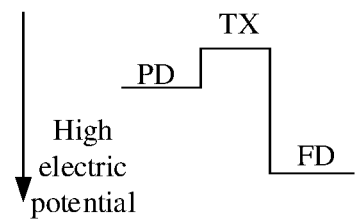
FIG. 2a is a schematic diagram of potential distribution of a PD, a region under a gate of a TX, and an FD in a case that the TX is turned off.
Figure 2B:
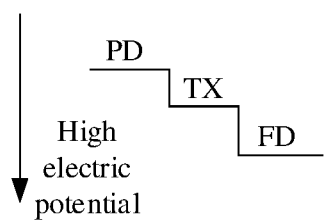
Figure 3:
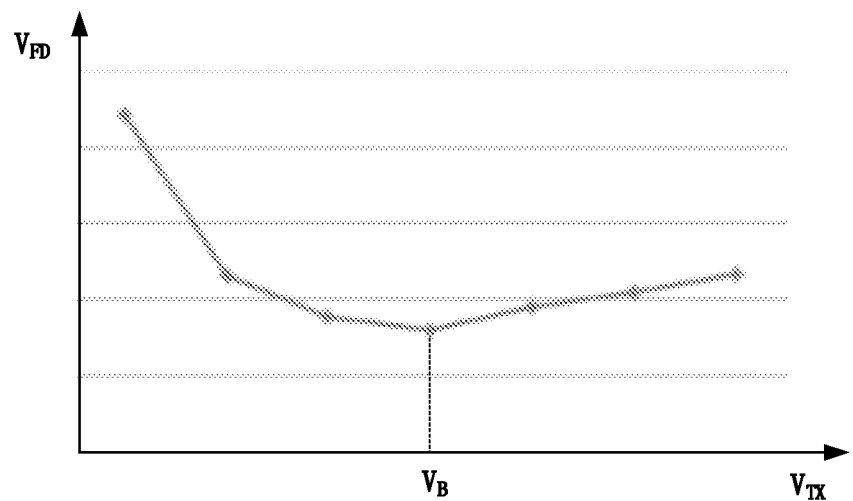
FIG. 3 is a schematic diagram showing a circuit for regulating a gate voltage according to an embodiment of the present disclosure.

FIG. 3 shows a result of a further research of the inventor on the above two aspects, showing a change of a voltage $V_{FD}$ of a floating diffusion node FD (i.e., a signal storage unit) with a gate voltage $V_{TX}$ of a transmission gate TX. A small voltage of the FD represents that a large number of electrons are transferred to the FD. The $V_{TX}$ corresponding to the lowest value of the $V_{FD}$ is the optimal value obtained after balancing the two influencing factors of the charge transfer efficiency and the charge injection.

As shown in FIG. 3, with the increase of $V_{TX}$, the voltage of the FD firstly is decreased and then is increased, and has a lowest point $V_B$. In a case that the $V_{TX}$ is small, a voltage difference between a region under a gate of the TX and the PD is small, the charge transfer efficiency is low, a small number of electrons are transferred to the FD in a fixed time period t, and the voltage of the FD is high. As the gate voltage $V_{TX}$ is increased, the charge transfer efficiency is increased, the number of electrons transferred to the FD in the same time period as the fixed time period is increased, and the voltage of the FD is decreased. In the case of $V_{TX}=V_B$, the $V_{FD}$ reaches a minimum value. As the gate voltage $V_{TX}$ is further increased, the number of electrons remaining under the gate is increased, and a case that charges are injected back into the PD appears, so that the total number of electrons transferred to the FD is decreased, and the $V_{FD}$ starts to be increased.

Based on the above research and analysis, the following technical solution is proposed by the inventor, in which the $V_{FD}$ under different gate voltages are detected and compared to reduce the charge injection while ensuring a relative high charge transfer efficiency.

There are provided a circuit for regulating a gate voltage, a method for regulating a gate voltage, and a sensor applying the same according to embodiments of the present disclosure. The circuit for regulating a gate voltage, the method for regulating a gate voltage, and the sensor applying the same are based on the same inventive concept, because the problem is solved by similar principles. Therefore, implementations of the circuit for regulating a gate voltage, the method for regulating a gate voltage and the sensor applying the same can be referred to each other, and repeated parts thereof are not described in detail herein.

Figure 4:
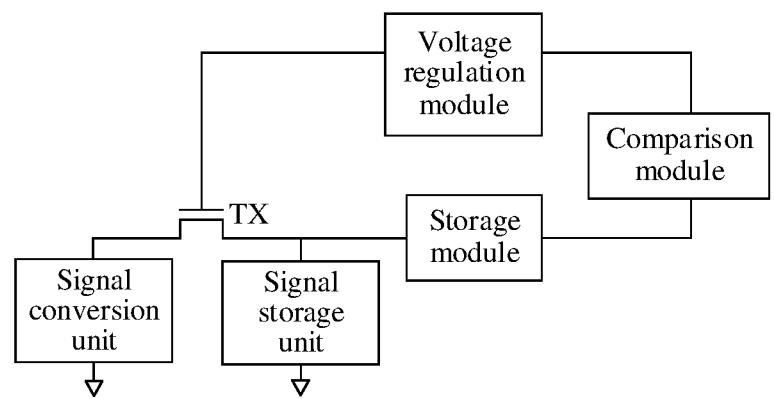
FIG. 4 is a schematic diagram showing a circuit for regulating a gate voltage according to an embodiment of the present disclosure.

FIG. 4 is a schematic diagram showing a circuit for regulating a gate voltage according to an embodiment of the present disclosure. The circuit includes a storage module, a comparison module, and a voltage regulation module. An input end of the storage module is connected to a first end of a signal storage unit, and an output end of the storage module is connected to an input end of the comparison module. An output end of the comparison module is connected to an input end of the voltage regulation module. An output end of the voltage regulation module is connected to a transmission gate.

The storage module is configured to store electrical signals outputted by the signal storage unit. The comparison module is configured to compare at least two electrical signals that correspond to different gate voltages and that are outputted by the signal storage unit to obtain a comparison result. The voltage regulation module is configured to regulate, based on the comparison result, an output voltage according to a predetermined rule to change the gate voltage of the transmission gate.

It should be noted that the above-mentioned electrical signal includes at least one of a voltage signal and a current signal. The signal conversion unit is configured to convert any signal involved in the conventional technology, such as a magnetic signal, a pressure signal, or an optical signal, into an electrical signal, which is not limited herein. The following description is given by taking a case that the electrical signal outputted by the signal storage unit is a voltage signal and the signal conversion unit is configured to perform photoelectric conversion as an example. In the embodiment of the present disclosure, charges generated by the signal conversion unit under different gate voltages are transferred from the signal conversion unit to the signal storage unit to form voltage signals. The voltage signals are stored by the storage module. At least two of the voltage signals are compared by the comparison module, and the comparison result is used to regulate the gate voltage applied to the transmission gate to reduce the voltage signal of the signal storage unit. Under the same turn-on time of the transmission gate, a low voltage of the signal storage unit means that a large number of charges are transferred to the signal storage unit in a current period. The gate voltage corresponding to the minimum voltage of the signal storage unit is the optimal value obtained after balancing the two influencing factors of the charge transfer efficiency and the charge injection. In this way, the charge injection is reduced while the charge transfer efficiency is relative high.

Similarly, in a case that the electrical signal outputted by the signal storage unit is a current signal, a large current signal means that a large number of charges are transferred to the signal storage unit. Therefore, the gate voltage corresponding to the maximum current signal is the optimal value obtained after balancing the two influencing factors of the charge transfer efficiency and the charge injection.

The comparison module involved in the embodiment of the present disclosure may be implemented by a comparator having a forward input terminal and a reverse input terminal. The comparator is configured to receive and compare at least two of the electrical signals stored by the storage unit. The voltage regulation module is configured to perform, based on the comparison result, voltage regulation according to the predetermined rule. The regulated voltage is used as the gate voltage of the transmission gate TX in a next period.

The predetermined rule may include the following rules. In the case that the electrical signal outputted by the signal storage unit is a voltage signal, the voltage regulation module increases the output voltage if a current electrical signal value of the signal storage unit is less than an electrical signal value in a previous period, otherwise the voltage regulation module decreases the output voltage.

In the case that the electrical signal outputted by the signal storage unit is a current signal, the voltage regulation module increases the output voltage if a current electrical signal value of the signal storage unit is greater than an electrical signal value in a previous period, otherwise the voltage regulation module decreases the output voltage.

In a possible implementation manner, based on the above embodiments of the present disclosure, the storage module includes at least two storage units. An input end of each storage unit is connected to the input end of the storage module, and an output end of the storage unit is connected to at least one input terminal of the comparison module. For example, the storage module includes two storage units, which are a first storage unit and a second storage unit, respectively.

The first storage unit is connected to the input end of the storage module via a first switch, and is connected to one input terminal of the comparison module via an eighth switch. The one input terminal herein may be referred to as a first input terminal.

The second storage unit is connected to the input end of the storage module via a second switch, and is connected to the other input terminal of the comparison module via a ninth switch. The other input terminal herein may be referred to as a second input terminal.

The first storage unit obtains and stores the electrical signal outputted by the signal storage unit by turning on the first switch S1, and the second storage unit obtains and stores the electrical signal outputted by the signal storage unit by turning on the second switch S2. In addition, the electrical signal stored by the first storage unit is inputted into the comparison module for comparison by turning on the eighth switch S8, and the electrical signal stored by the second storage unit is inputted into the comparison module for comparison by turning on and the ninth switch S9. The first storage unit and the second storage unit may be implemented by capacitors when used for storing voltage, and may be implemented by inductors when used for storing current.

The above two storage units respectively store the electrical signals of the signal storage units under different gate voltages of the TX in the comparison state. The electrical signals of the signal storage units under different gate voltages of the TX may be electrical signals $S_i$ and $S_{i+1}$ that are outputted by the signal storage unit after completing transfer of the charges from the signal conversion unit to the signal storage unit for adjacent periods, where $S_i$ represents an electrical signal of the signal storage unit after an i-th charge transfer, and $S_{i+1}$ represents an electrical signal of the signal storage unit after an (i+1)-th charge transfer. After a current comparison is completed, the storage unit storing the electrical signal $S_i$ obtains the electrical signal $S_{i+1}$ for comparison with a signal $S_{i+2}$ in a next period.

The storage module may include three or more storage units. For example, in a case that storage module includes three storage units, two of the storage units are connected to the same input terminal of the comparison module. For example, the first storage unit and the third storage unit are connected to the first input terminal of the comparison module, and the second storage unit is connected to the second input terminal of the comparison module. The first storage unit and the third storage unit alternately store the same electrical signal as the second storage unit. For example, in a case that the first storage unit and the second storage unit store the same electrical signal of the signal storage unit, the conduction between the third storage unit and the comparison module and the conduction between the second storage unit and the comparison module are provided in a current period, for comparison of the electrical signals of the current period, and the electrical signal stored in the first storage unit is used to be compared with an updated electrical signal of the second storage unit in a next period. In this way, the newly inputted electrical signal is always outputted to the second input terminal of the comparison module, and the electrical signal of the previous period is outputted to the first input terminal of the comparison module, thereby facilitating direction consistency of the voltage regulation performed according to the comparison result.

Figure 6:
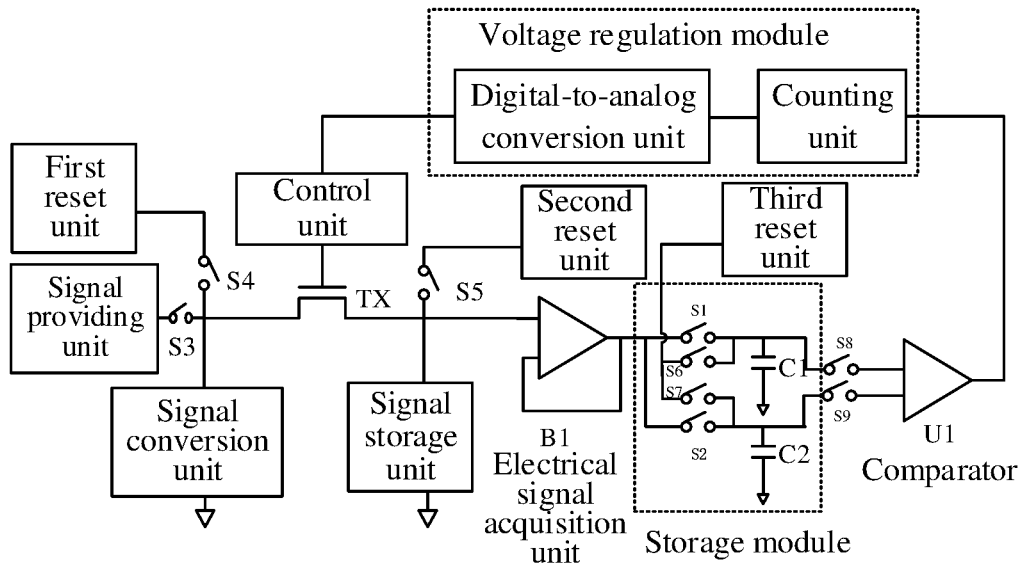
FIG. 6 is a schematic diagram showing a circuit for regulating a gate voltage according to another embodiment of the present disclosure.

As shown in FIG. 6, based on the above embodiments, a third reset unit is further provided. The third reset unit is connected to a first end of the first storage unit via a sixth switch, and is connected to a first end of the second storage unit via a seventh switch. The third reset unit is configured to reset at least two storage units.

It should be understood that, the first storage unit and the second storage unit are required to be reset before performing a next storage, to avoid interference of the current storage to the next storage.

The operation processes of the first storage unit and the second storage unit are exemplarily described below. The seventh switch is turned on to reset the second storage unit, and the seventh switch is turned off after the reset. The second switch is turned on to store the current electrical signal of the signal storage unit in the second storage unit, and is turned off after the storage is completed. The eighth switch and the ninth switch are turned on to compare voltage values of the two storage units, and are turned off after the comparison. The sixth switch is turned on to reset the first storage unit, and is turned off after the reset. The first switch is turned on to store the current FD voltage to the first storage unit, for comparison with the FD voltage stored to the second energy storage unit in the next period.

Figure 5:
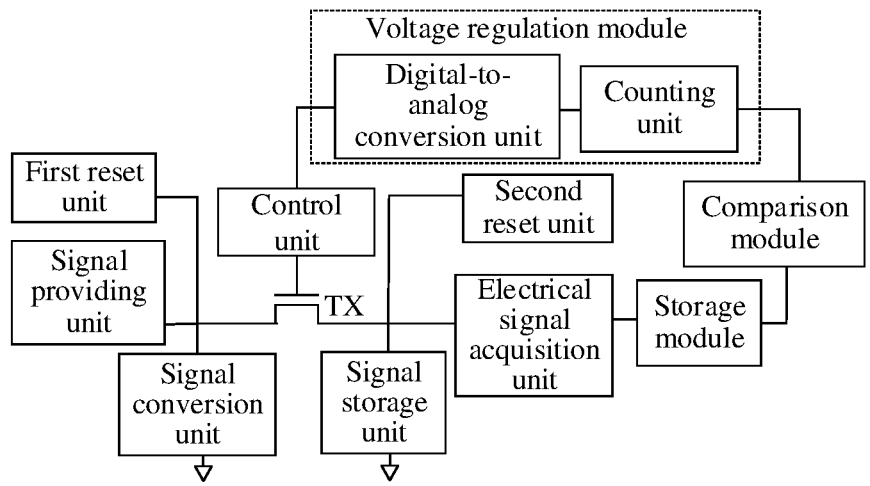
FIG. 5 is a schematic diagram showing a circuit for regulating a gate voltage according to another embodiment of the present disclosure.

In an embodiment of the present disclosure, as shown in FIG. 5 and FIG. 6, the voltage regulation module includes a counting unit and a digital-to-analog conversion unit. An input end of the counting unit is connected to the input end of the voltage regulation module. The counting unit is configured to perform accumulative counting according to the comparison result. One end of the digital-to-analog conversion unit is connected to an output end of the counting unit, and the other end of the digital-to-analog conversion unit is connected to the output end of the voltage regulation module. The digital-to-analog conversion unit is configured to convert and output a corresponding voltage based on the accumulated count according to a predetermined correspondence relationship.

For example, the counting unit performs accumulative counting according to the comparison result in the following manner. In a case that the comparison result is 1, the accumulated count of the counting unit is increased by 1. In addition, in a case that the comparison result is 0, the accumulated count of the counting unit is decreased by 1.

In a specific embodiment, the predetermined correspondence relationship may be that the voltage outputted by the digital-to-analog conversion module is proportional to the accumulated count. That is, the voltage outputted by the digital-to-analog conversion module is increased as the accumulated count is increased, and is decreased as the accumulated count is decreased. Further, the voltage outputted by the digital-to-analog conversion module may change with the accumulated count in a one-to-one correspondence. Exemplarily, every time the accumulated count changes by 1, the voltage converted and outputted by the digital-to-analog conversion module changes by 0.1V. That is, if the accumulated count is 1, the digital-to-analog conversion module converts and outputs a voltage of 1.1V. In addition, if the accumulated count is 2, the digital-to-analog conversion module converts and outputs a voltage of 1.1V, and so on.

In an embodiment of the present disclosure, based on the above embodiments, the circuit for regulating a gate voltage further includes an electrical signal acquisition unit. One end of the electrical signal acquisition unit is connected to the first end of the signal storage unit, and the other end of the electrical signal acquisition unit is connected to the input end of the storage module. The electrical signal acquisition unit is configured to acquire the electrical signals outputted by the signal storage unit and output the electrical signals to the storage module. Further, the electrical signal acquisition unit is further used to isolate the signal storage unit from the storage module, to prevent a subsequent unit from interfering with the signal storage unit. The electrical signal acquisition unit may be implemented by a buffer, a source follower, or the like. The following description is given by taking the buffer as an example. A first input terminal of the buffer is connected to the first end of the signal storage unit, and a second input terminal of the buffer is connected to an output terminal of the buffer. A common terminal between the output terminal of the buffer and the second input terminal of the buffer is connected to the input end of the storage module.

In an embodiment of the present disclosure, based on the above embodiments, the circuit for regulating a gate voltage further includes a control unit. One end of the control unit is connected to the output end of the voltage regulation module, and the other end of the control unit is connected to the transmission gate. The control unit is configured to perform control to apply or not apply the voltage outputted by the voltage regulation module to the transmission gate. The voltage regulation module may apply the voltage outputted by the voltage regulation module to the transmission gate TX according to a predetermined timing after the signal conversion unit completes the charge injection. A duration of applying the voltage is long enough so that the charges transferred to the signal storage unit no longer change, or is preferably a fixed value t.

In an embodiment of the present disclosure, based on the above embodiments, the circuit for regulating a gate voltage further includes an electrical signal processing unit. One end of the electrical signal processing unit is connected to the first end of the signal storage unit, and the other end of the electrical signal processing unit is connected to the input end of the storage module. The electrical signal processing unit is configured to convert a current signal into a voltage signal or convert a voltage signal into a current signal.

In an embodiment of the present disclosure, based on the above embodiments, the circuit for regulating a gate voltage further includes a second reset unit. The second reset unit is connected to the first end of the signal storage unit via a fifth switch. The second reset unit is configured to reset the signal storage unit. In each period, the signal storage unit is reset before the transmission gate is turned on, to accurately obtain charges transferred to the signal storage unit in each period, thereby avoiding interference of residual charges to the electrical signal in the signal storage unit in the next period.

In an embodiment of the present disclosure, based on the above embodiments, the circuit for regulating a gate voltage further includes a signal providing unit. The signal providing unit is connected to a first end of the signal conversion unit via a third switch. The signal providing unit is configured to provide a preset number of signals to the signal conversion unit, to be converted into electrical signals. In order to avoid an impact of inconsistency of the number of charges stored in the signal conversion unit on the electrical signal of the signal storage unit in the current period, the signal providing unit is further provided to input the same signal to the signal conversion unit in each period to generate the same number of charges. The signal providing unit may be implemented by any one of a power supply, a light source, a pressure source, and a magnetic source. In a case that the signal conversion unit is a photoelectric conversion unit, the embodiments of the present disclosure can be implemented in a dark field, so as to further eliminate the influence of the photo-generated charges generated due to a background light on the regulation process.

In an embodiment of the present disclosure, based on the above embodiments, the circuit for regulating a gate voltage further includes a first reset unit. The first reset unit is connected to the first end of the signal conversion unit via a fourth switch. The first reset unit is configured to reset the signal conversion unit. In order to avoid the inconsistency of the number of charges in the signal conversion unit in each period, which is caused due to the accumulation of residual charges in the signal conversion unit in a previous period, the first reset unit is further provided in this embodiment, to reset the signal conversion unit before each turn-on of the signal providing unit.

One or more of the first reset unit, the second reset unit and the third reset unit may time-share the same reset unit, which may be a power supply.

In an embodiment of the present disclosure, as shown in FIG. 6, the electrical signal acquisition unit in this embodiment is implemented by a buffer B1. One end of the FD is connected to a first input terminal of the buffer B1. A second input terminal of the buffer B1 is connected to an output terminal of the buffer. The output terminal of the buffer is connected to the storage module.

In this embodiment, the comparison module may be implemented by a comparator U1.

In this embodiment, the storage module includes a first storage unit and a second storage unit. The first storage unit is implemented by a capacitor C1. A first terminal of the capacitor C1 is connected to the output terminal of the electrical signal acquisition unit via the first switch S1, and is connected to a positive input terminal of the comparator U1. A second terminal of the capacitor C1 is grounded. The second storage unit is implemented by a capacitor C2. A first terminal of the capacitor C2 is connected to the output terminal of the electrical signal acquisition unit via the second switch, and is connected to a negative input terminal of the comparator U1. A second terminal of the capacitor C2 is grounded.

In order to store the next inputted data, the third reset unit is further provided to reset the storage device. The first storage unit is connected to the third reset unit via the sixth switch S6. The second storage unit C2 is connected to the third reset unit via the seventh switch S7.

The first storage unit is connected to the positive input terminal of the comparator, and the second storage unit is connected to the negative input terminal of the comparator. An output terminal of the comparator, the counting unit, the digital-to-analog conversion unit, and the control unit are sequentially connected. An output voltage of the digital-to-analog conversion unit is applied to the transmission gate TX under the control of the control unit.

The first end of the signal storage unit is connected to the second reset unit via the fifth switch S5, and the second end of the signal storage unit is grounded. The first end of the signal conversion unit is connected to the signal providing unit via the third switch, and is also connected to the first reset unit via the fourth switch. The second end of the signal conversion unit is grounded.

A method for regulating a gate voltage is further provided according to an embodiment of the present disclosure. The method is based on the circuit for regulating a gate voltage according to any of the above embodiments. The method includes:

comparing, by the comparison module, electrical signals that are outputted by the signal storage unit after being applied with different gate voltages and that are stored in the storage module to obtain a comparison result; and regulating, based on the comparison result, an output voltage of the voltage regulation module according to the predetermined rule, where the output voltage of the voltage regulation module serves as a gate voltage for a next period.

The regulation process is performed according to the predetermined rule in the following manner. In a case that the electrical signal outputted by the signal storage unit is a voltage signal, the output voltage is increased by the voltage regulation module if a current electrical signal value of the signal storage unit is less than an electrical signal value in a previous period, otherwise the output voltage is decreased. In a case that the electrical signal outputted by the signal storage unit is a current signal, the output voltage is increased by the voltage regulation module if a current electrical signal value of the signal storage unit is greater than an electrical signal value in a previous period, otherwise the output voltage is decreased.

In an embodiment of the present disclosure, based on the above embodiments, the method for regulating a gate voltage further includes:

determining whether the comparison result meets a predetermined condition to determine an optimal gate voltage; and determining a value range of the gate voltage based on the optimal gate voltage.

The process of determining whether the comparison result meets a predetermined condition to determine an optimal gate voltage is performed by performing the processes including: determining whether the comparison result changes; and if the comparison result changes, determining the output voltage of the voltage regulation module corresponding to a current period as the optimal gate voltage.

The predetermined condition is met in a case that the output result of the comparison module changes, for example, in a case that the comparison result changes from 1 to 0 or changes from 0 to 1. In this case, the output voltage of the voltage regulation module corresponding to the current period is the optimal gate voltage. The value range of the gate voltage of the transmission gate is determined based on the optimum gate voltage. For example, the gate voltage may fluctuate in an amount of ±15% from the optimum gate voltage. Optionally, the gate voltage may also fluctuate in an amount of ±10% or ±5% of the optimum gate voltage. The gate voltage is preferably equal to the optimal gate voltage.

In the method for regulating a gate voltage according to the embodiment of the present disclosure, based on the above embodiments, the process of comparing, by the comparison module, the electrical signals that are outputted by the signal storage unit after being applied with different gate voltages and that are stored in the storage module to obtain the comparison result is performed by the following processes including: turning on the eighth switch and the ninth switch, inputting current electrical signals respectively stored in the first storage unit and the second storage unit into the comparison module for comparison, and turning off the eighth switch and the ninth switch after obtaining the comparison result.

Before the eighth switch and the ninth switch are turned on, the method further includes: turning on the second switch to store the current electrical signal of the signal storage unit in the second storage unit.

After the eighth switch and the ninth switch are turned off, the method further includes: turning on the first switch to store the current electrical signal of the signal storage unit in the first storage unit.

In this way, the newly stored electrical signal is always outputted to the second input terminal of the comparison module, and the electrical signal of the previous period is outputted to the first input terminal of the comparison module, thereby facilitating direction consistency of the voltage regulation performed according to the comparison result.

In an embodiment of the present disclosure, based on the above embodiments, before storing the next electrical signal in the first storage unit and the second storage unit, the sixth switch and the seventh switch are turned on to respectively reset the first storage unit and the second storage unit by the third reset unit.

In an embodiment of the present disclosure, based on the above embodiments, the comparison result inputted to the voltage regulation module is accumulatively counted by the counting unit, and the accumulated counting result is converted into a corresponding voltage by the digital-analog conversion unit according to a predetermined correspondence relationship, as the output voltage of the voltage regulation module.

In an embodiment of the present disclosure, based on the above embodiments, the output voltage of the voltage regulation module is applied to the transmission gate according to a predetermined timing under the control of the control unit, to serve as the gate voltage.

In an embodiment of the present disclosure, based on the above embodiments, the signal outputted by the signal storage unit is converted and outputted by the electrical signal processing unit.

In an embodiment of the present disclosure, based on the above embodiments, before the transmission gate is turned on, the signal storage unit is reset by the second reset unit by turning on the fifth switch, and a preset number of signals are inputted to the signal conversion unit by the signal providing unit.

In an embodiment of the present disclosure, before the preset number of signals are inputted to the signal conversion unit by the signal providing unit, the method further includes: turning on the fourth switch, and resetting the signal conversion unit by the first reset unit.

In an embodiment of the present disclosure, the gate voltage is regulated by the following processes, including the following steps S101 to S105.

In S101, the transmission gate TX is turned on based on an inputted voltage, and is maintained at the turn-on state for a preset time duration t, and then is turned off.

In S102, a current electrical signal of the signal storage unit is stored in the second storage unit after reset.

In S103, the current electrical signal of the signal storage unit that is stored in the second storage unit is compared with the electrical signal of the signal storage unit in a previous period that is stored in the first storage unit.

In S104, voltage regulation is performed according to a predetermined rule based on the comparison result, to obtain the gate voltage applied to the transmission gate TX in a next period.

In S105, the first storage unit is reset and then stores the current electrical signal of the signal storage unit.

The above steps S101 to S105 are repeatedly performed until the comparison result of the comparison module changes. In this case, the gate voltage corresponding to the previous period is the optimal gate voltage.

The sequence numbers of the above steps do not limit the execution order of the method.

Before the transmission gate TX is turned on, a fixed number of signals may be inputted into the signal conversion unit. In addition, before the transmission gate TX is turned on, the signal storage unit may be reset. Before the fixed number of signals are inputted into the signal conversion unit, the signal conversion unit may be reset.

Figure 7:
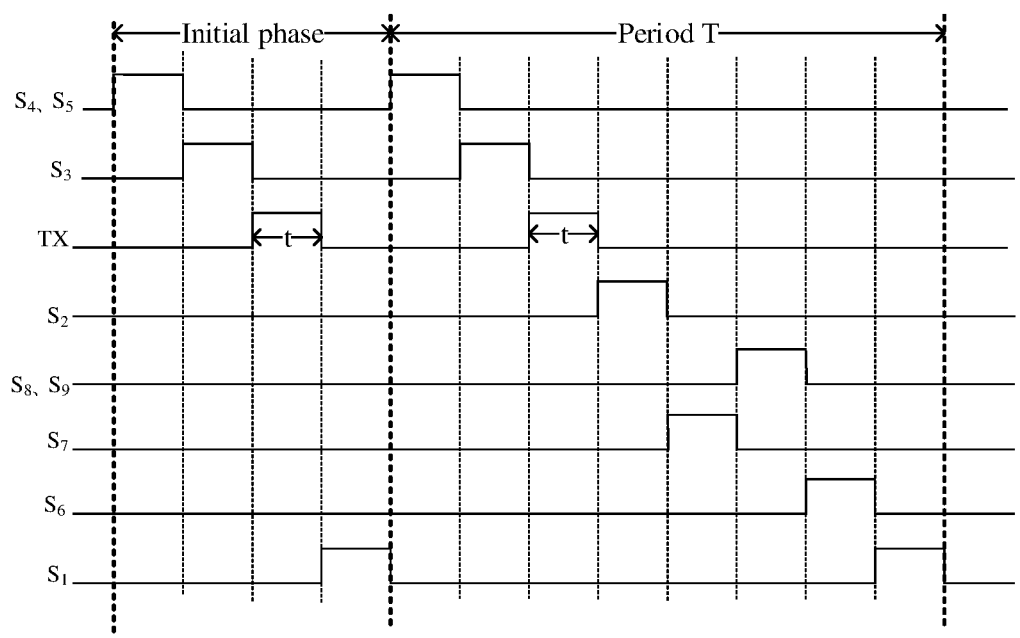
FIG. 7 is a timing diagram of a method for regulating a gate voltage according to an embodiment of the present disclosure.

In an embodiment of the present disclosure, the method for regulating a gate voltage is exemplarily described with reference to a timing shown in FIG. 7 based on the circuit for regulating a gate voltage shown in FIG. 6 by taking a photodiode as an example of the signal conversion unit. Specifically, the method includes an initial phase and a periodic cycle phase. The initial phase is used for the electrical signal storage of the first storage unit. A regulation timing of a period T in the periodic cycle phase is shown in FIG. 7.

In S201, the S4 is turned on so that the photodiode PD is reset, and then the S4 is turned off.

In S202, the S5 is turned on so that the floating diffusion node FD is reset, and then the S5 is turned off.

In S203, the S3 is turned on so that a fixed number of charges are injected into the photodiode PD through the signal providing unit.

In S204, the transmission gate TX applied with a gate voltage $V_0$ is turned on for a preset time duration t, and the charges in the photodiode PD are transferred to the floating diffusion node FD through the region under the gate of the transmission gate TX.

In S205, after the transmission gate TX is turned off, the first switch S1 is turned on so that the electrical signal acquisition unit inputs the acquired current voltage of the FD into the first storage unit, and then the first switch S1 is turned off.

In S206, the above steps S201 to S203 are repeatedly performed, the gate voltage of the transmission gate TX is changed and the transmission gate TX is turned on for a preset time duration t, and the charges in the photodiode PD are transferred to the floating diffusion node FD through the region under the gate of the transmission gate TX.

In S207, after the transmission gate TX is turned off, the second switch S2 is turned on so that the electric signal acquisition unit inputs the acquired current voltage of the FD into the second storage unit C2, and then the second switch S2 is turned off.

In S208, the eighth switch and the ninth switch are turned on so that the voltages stored in the first storage unit C1 and the second storage unit C2 are respectively inputted to the positive input terminal and the negative input terminal of the comparator for comparison, and the comparison result is converted into the corresponding voltage through the voltage regulation module.

In S209, the seventh switch S7 is turned on so that the second storage unit C2 is reset through the third reset unit.

In S210, the sixth switch S6 is turned on so that the first storage unit is reset through the third reset unit.

In S211, the first switch S1 is turned on so that the electrical signal acquisition unit inputs the acquired current voltage of the FD into the first storage unit, and then the second switch S1 is turned off.

In S212, the steps S206 to S211 are repeatedly performed until the comparison result of the comparator changes. In this case, the output voltage of the voltage regulation module in the current period is the optimal gate voltage.

A sensor is further provided according to an embodiment of the present disclosure. At least one pixel in the sensor is connected to the circuit for regulating a gate voltage described above. A gate voltage of a transmission gate of the at least one pixel in the sensor is obtained based on the method for regulating a gate voltage described above.

The invention claimed is:

1. A circuit for regulating a gate voltage, the circuit comprising:
a storage module;
a comparison module; and
a voltage regulation module, wherein
an input end of the storage module is connected to a first end of a signal storage unit, an output end of the storage module is connected to an input end of the comparison module, an output end of the comparison module is connected to an input end of the voltage regulation module, and an output end of the voltage regulation module is connected to a transmission gate;
the storage module is configured to store electrical signals outputted by the signal storage unit;
the comparison module is configured to compare at least two electrical signals that correspond to different gate voltages and that are outputted by the signal storage unit to obtain a comparison result; and
the voltage regulation module is configured to regulate, based on the comparison result, an output voltage according to a predetermined rule to change the gate voltage of the transmission gate,
wherein the storage module comprises at least two storage units, an input end of each of the storage units is connected to the input end of the storage module, and an output end of the storage unit is connected to at least one input terminal of the comparison module, and the at least two storage units comprise a first storage unit and a second storage unit, and wherein
the first storage unit is connected to the input end of the storage module via a first switch, and the first storage unit is connected to one input terminal of the comparison module via an eighth switch; and
the second storage unit is connected to the input end of the storage module via a second switch, and the second storage unit is connected to the other input terminal of the comparison module via a ninth switch.

2. The circuit according to claim 1, wherein the voltage regulation module comprises:
a counting unit, wherein an input end of the counting unit is connected to the input end of the voltage regulation module, and the counting unit is configured to perform accumulative counting according to the comparison result; and
a digital-to-analog conversion unit, wherein one end of the digital-to-analog conversion unit is connected to an output end of the counting unit, and the other end of the digital-to-analog conversion unit is connected to the output end of the voltage regulation module, and wherein the digital-to-analog conversion unit is configured to convert and output a corresponding voltage based on the accumulated count according to a predetermined correspondence relationship.

3. The circuit according to claim 1, further comprising:
an electrical signal acquisition unit, wherein
one end of the electrical signal acquisition unit is connected to the first end of the signal storage unit, and the other end of the electrical signal acquisition unit is connected to the input end of the storage module; and
the electrical signal acquisition unit is configured to acquire the electrical signals outputted by the signal storage unit and output the electrical signals to the storage module.

4. The circuit according to claim 1, further comprising:
a control unit, wherein
one end of the control unit is connected to the output end of the voltage regulation module, and the other end of the control unit is connected to the transmission gate; and
the control unit is configured to apply, based on a predetermined condition, the voltage outputted by the voltage regulation module to the transmission gate.

5. The circuit according to claim 1, further comprising:
an electrical signal processing unit, wherein
one end of the electrical signal processing unit is connected to the first end of the signal storage unit, and the other end of the electrical signal processing unit is connected to the input end of the storage module; and
the electrical signal processing unit is configured to convert a current signal into a voltage signal or convert a voltage signal into a current signal.

6. The circuit according to claim 1, further comprising:
a signal providing unit, wherein the signal providing unit is connected to a first end of a signal conversion unit via a third switch, and the signal providing unit is configured to input a to-be-converted signal to the signal conversion unit.

7. The circuit according to claim 6, further comprising:
a reset module, comprising at least one of the following reset units: a first reset unit, a second reset unit and a third reset unit, wherein
the first reset unit is connected to the first end of the signal conversion unit via a fourth switch, and the first reset unit is configured to reset the signal conversion unit;
the second reset unit is connected to the first end of the signal storage unit via a fifth switch, and the second reset unit is configured to reset the signal storage unit; and
the third reset unit is connected to the first storage unit via a sixth switch and is connected to the second storage unit via a seventh switch, and the third reset unit is configured to reset the at least two storage units.

8. A method for regulating a gate voltage, the method being performed by the circuit for regulating a gate voltage according to claim 1, the method comprising:
comparing electrical signals that are outputted by the signal storage unit after being applied with different gate voltages and that are stored in the storage module to obtain a comparison result; and
regulating, based on the comparison result, an output voltage of the voltage regulation module according to the predetermined rule, wherein the regulated output voltage of the voltage regulation module serves as a gate voltage for a next period.

9. The method according to claim 8, wherein the regulating, based on the comparison result, an output voltage of the voltage regulation module according to the predetermined rule comprises:
in a case that the electrical signal outputted by the signal storage unit is a voltage signal, increasing the output voltage by the voltage regulation module if a current electrical signal value of the signal storage unit is less than an electrical signal value in a previous period, otherwise decreasing the output voltage; and
in a case that the electrical signal outputted by the signal storage unit is a current signal, increasing the output voltage by the voltage regulation module if a current electrical signal value of the signal storage unit is greater than an electrical signal value in a previous period, otherwise decreasing the output voltage.

10. The method according to claim 8, further comprising:
determining whether the comparison result meets a predetermined condition to determine an optimal gate voltage; and
determining a value range of the gate voltage based on the optimal gate voltage; wherein
the determining whether the comparison result meets a predetermined condition to determine an optimal gate voltage includes:
determining whether the comparison result changes; and
if the comparison result changes, determining the output voltage of the voltage regulation module corresponding to a current period as the optimal gate voltage.

11. The method according to claim 8, wherein
the comparing electrical signals that are outputted by the signal storage unit after being applied with different gate voltages and that are stored in the storage module to obtain a comparison result comprises: turning on the eighth switch and the ninth switch, inputting current electrical signals respectively stored in the first storage unit and the second storage unit into the comparison module for comparison, and turning off the eighth switch and the ninth switch after obtaining a comparison result;
before the eighth switch and the ninth switch are turned on, the method further comprises: turning on the second switch to store the current electrical signal of the signal storage unit in the second storage unit; and
after the eighth switch and the ninth switch are turned off, the method further comprises: turning on the first switch to store the current electrical signal of the signal storage unit in the first storage unit.

12. The method according to claim 11, wherein
before the turning on the second switch to store the current electrical signal of the signal storage unit in the second storage unit, the method further comprises: turning on a seventh switch, and resetting the second storage unit by a third reset unit; and
before the turning on the first switch to store the current electrical signal of the signal storage unit in the first storage unit, the method further includes: turning on a sixth switch, and resetting the first storage unit by the third reset unit.

13. The method according to claim 8, wherein regulating the output voltage of the voltage regulation module according to the predetermined rule comprises:
accumulatively counting the inputted comparison result by a counting unit; and
converting, by a digital-to-analog conversion unit, the accumulated counting result into a corresponding voltage according to a predetermined correspondence relationship, as the output voltage of the voltage regulation module.

14. The method according to claim 13, wherein before the output voltage of the voltage regulation module is applied to the transmission gate, the method further comprises:
turning on a fifth switch, and resetting the signal storage unit by a second reset unit;
turning on a fourth switch, and resetting the signal conversion unit by a first reset unit; and
turning on a third switch, and inputting, by the signal providing unit, a preset number of signals to the signal conversion unit.

15. A sensor, applying the circuit for regulating a gate voltage according to claim 1.

16. A circuit for regulating a gate voltage, the circuit comprising:
a storage module;
a comparison module; and
a voltage regulation module, wherein
an input end of the storage module is connected to a first end of a signal storage unit, an output end of the storage module is connected to an input end of the comparison module, an output end of the comparison module is connected to an input end of the voltage regulation module, and an output end of the voltage regulation module is connected to a transmission gate;
the storage module is configured to store electrical signals outputted by the signal storage unit;
the comparison module is configured to compare at least two electrical signals that correspond to different gate voltages and that are outputted by the signal storage unit to obtain a comparison result; and
the voltage regulation module is configured to regulate, based on the comparison result, an output voltage according to a predetermined rule to change the gate voltage of the transmission gate, wherein the voltage regulation module comprises:
a counting unit, wherein an input end of the counting unit is connected to the input end of the voltage regulation module, and the counting unit is configured to perform accumulative counting according to the comparison result; and
a digital-to-analog conversion unit, wherein one end of the digital-to-analog conversion unit is connected to an output end of the counting unit, and the other end of the digital-to-analog conversion unit is connected to the output end of the voltage regulation module, and wherein the digital-to-analog conversion unit is configured to convert and output a corresponding voltage based on the accumulated count according to a predetermined correspondence relationship.

17. A circuit for regulating a gate voltage, the circuit comprising:
a storage module;
a comparison module; and
a voltage regulation module, wherein
an input end of the storage module is connected to a first end of a signal storage unit, an output end of the storage module is connected to an input end of the comparison module, an output end of the comparison module is connected to an input end of the voltage regulation module, and an output end of the voltage regulation module is connected to a transmission gate;
the storage module is configured to store electrical signals outputted by the signal storage unit;
the comparison module is configured to compare at least two electrical signals that correspond to different gate voltages and that are outputted by the signal storage unit to obtain a comparison result; and
the voltage regulation module is configured to regulate, based on the comparison result, an output voltage according to a predetermined rule to change the gate voltage of the transmission gate,
the circuit further comprising an electrical signal processing unit, wherein
one end of the electrical signal processing unit is connected to the first end of the signal storage unit, and the other end of the electrical signal processing unit is connected to the input end of the storage module; and the electrical signal processing unit is configured to convert a current signal into a voltage signal or convert a voltage signal into a current signal.

\* \* \* \* \*